United States Patent
Grobman et al.

(10) Patent No.: US 6,605,395 B2
(45) Date of Patent: Aug. 12, 2003

(54) METHOD AND APPARATUS FOR FORMING A PATTERN ON AN INTEGRATED CIRCUIT USING DIFFERING EXPOSURE CHARACTERISTICS

(75) Inventors: Warren D. Grobman, Austin, TX (US); Ruoping Wang, Austin, TX (US); Alfred J. Reich, Austin, TX (US)

(73) Assignee: Motorola, Inc., Schaumburg, IL (US)

( * ) Notice: Subject to any disclaimer, the term of this patent is extended or adjusted under 35 U.S.C. 154(b) by 108 days.

(21) Appl. No.: 09/885,575

(22) Filed: Jun. 20, 2001

(65) Prior Publication Data
US 2002/0197541 A1 Dec. 26, 2002

(51) Int. Cl.$^7$ ................................................. G03F 9/00
(52) U.S. Cl. ........................................................ 430/5
(58) Field of Search ........................... 430/5, 322, 323, 430/324, 311, 313; 378/34, 35

(56) References Cited

U.S. PATENT DOCUMENTS 5,541,026 A * 7/1996 Matsumoto ..................... 430/5

2002/0068227 A1 * 6/2002 Wang et al. ..................... 430/5

* cited by examiner

*Primary Examiner*—S. Rosasco
(74) *Attorney, Agent, or Firm*—James L. Clingan, Jr.; Kim-Marie Vo

(57) ABSTRACT

A method of patterning a wafer using four areas with differing exposure characteristics is disclosed. Two areas are phase shifted relative to the other two areas in order to create unexposed areas on the integrated circuit. Two different areas have polarizations orthogonal to each other, are frequency shifted relative to the two other areas, or are exposed by light at a time different than the two other areas to form exposed areas on the integrated circuit. The exposed areas are subsequently removed from the integrated circuit. In one embodiment, the four areas are on the same mask. The use of four areas with differing exposure characteristics allows for the patterning of more complicated and smaller geometric patterns on the integrated circuit than traditional patterning methods.

24 Claims, 2 Drawing Sheets

METHOD AND APPARATUS FOR FORMING A PATTERN ON AN INTEGRATED CIRCUIT USING DIFFERING EXPOSURE CHARACTERISTICS

RELATED APPLICATION

This is related to U.S. patent application Ser. No. 09/727,666 filed Dec. 1, 2000, which is entitled "Method and Apparatus for Making an Integrated Circuit Using Polarization Properties of Light" and assigned to the assignee hereof.

FIELD OF THE INVENTION

This invention relates to integrated circuit lithography and more particularly to the use of various properties of light in making the integrated circuits.

BACKGROUND OF THE INVENTION

A technique that is becoming important in the drawing of lines and features in an integrated circuit is a technique known as phase shift, which refers to a type of mask which provides for a 180 degree phase shift between various portions on the mask. That is, the light passing through the mask in some areas has a 180 degree phase shift in relation to light passing to the mask in other areas. This technique is very useful in drawing sharp lines by providing cancellation of the light at these phase shift boundaries where the light has the 180 degrees phase difference. One of the problems relating to this technology is that this 180 degrees phase difference also occurs in areas where lines are not necessarily intended to be drawn. The result has been that in these regions where there is no line intended to be drawn a second mask is utilized to remove or ensure exposure of the photoresist in those regions. In addition to the extra cost of this extra step, there are also alignment issues between the two mask steps. One of the difficulties with the use of phase shift masks has been the problems associated with the areas of interface between the different phase shifted areas. This difficulty has impeded the development of phase shift masks in the processing of integrated circuits.

One of the difficulties that arises is that the constraints on how the different features can be arranged and the typical routing techniques for maximizing the density of the packing of the different features has to be altered. Thus, this requirement of the second mask reduces the efficiency of the use of the available space that is available and creates additional concerns that must be accounted for in checking for violations of layout rules. Further, by virtue of having to utilize the second mask, there are alignment issues that create marginality problems that can result in the circuit not working as designed or the circuit designer having to take into account that these margin variations will occur in the operation. Furthermore, the two differing areas of phase shift limit the geometrical patterns that can be actually patterned in this manner.

Thus, there is not the full generality of layout possibilities that is present normally, without the use of phase shift masks. Thus there is seen a need for an improved ability to use phase shift masks in achieving circuit designs.

BRIEF DESCRIPTION OF THE DRAWINGS

The present invention is illustrated by way of example and not by limitation in the accompanying figures, in which like references indicate similar elements, and in which.

Shown in FIG. 1 is a layout which may be achieved using the present invention.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION

Figures 1, 2, 3:
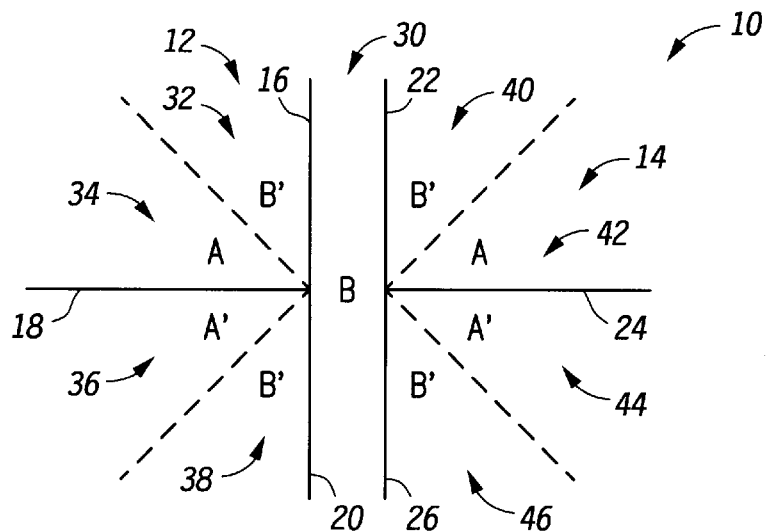
FIG. 2 is a table useful in understanding the invention.
FIG. 3 is another table useful in understanding the invention.

On a semiconductor wafer that is used for forming integrated circuits, features are typically formed by exposing photoresist according to a pattern. One such pattern is shown in FIG. 1 showing two T-gate transistors that are as close together as the particular technology allows. This demonstrates a need for four different states of light for providing the needed exposures. The overall result is achieved in one embodiment by using one light that has two states comprising a first polarization and two phases that are 180 degrees apart and another light that has two states comprising a different polarization and two phases that are 180 degrees apart. The result is that the desired lines are drawn using light of the same polarization but different phase and allowing an interface between light that has a different polarization without regard to phase. By virtue of having the different polarization, the light does not cancel at the interface even if the phase difference is 180 degrees.

Shown in FIG. 1 is an exemplary issue or problem and a solution according to the present invention. Shown in FIG. 1 is an integrated circuit 10 having a transistor 12 and a transistor 14. Transistor 12 and transistor 14 are both T gate transistors. Transistor 12 has a first line 16, second line 18, and a third line 20. Lines 16–20 comprise a gate of transistor 12. Transistor 14 has a first line 22, second line 24, and a third line 26. Lines 22–26 comprise a gate of transistor 14. First line 16 and first line 20 can be viewed as one continuous line that is intersected by line 18 to form a T intersection. Similarly, line 22 and line 26 can be viewed as one continuous line intersected by second line 24 to form a T intersection. In this particular instance the distance between line 16 and line 22 is a minimum distance that is available to be drawn by the particular technology. In this particular instance these two T gate transistors 12 and 14 are as close together as can be achieved by the technology in question or the technology that is in use in this example. For example, this may be of the order of 0.1 micron. That may also be the width of lines 16–26.

This particular structure has not effectively been achievable using conventional typical phase shift mask techniques, which provide just two types of light, one that is 180 degrees out of phase with the other. For example, in the region 30, between transistors 12 and 14, which is the minimum dimension region, would be one phase. For example, in order to draw the line 16, the regions adjacent to line 16, regions 30 and 32 plus 34, would have to be 180 degrees out of phase. But, in order to draw line 18, line 18 would also have to be bordered by two types of light that are 180 degrees out of phase. Similarly, for line 20, the light in region 30 would have to be 180 degrees out-of-phase with the light bordering line 20. With only two kinds of light that are 180 degrees out of phase, this required set of conditions cannot be achieved with a single exposure.

Shown in FIG. 1 are four states of light A, A', B, and B'. Referring to FIG. 2 is a table which defines the different states of light that are available. In this example, state B has a polarization that is vertical and has a phase of zero degrees. State B' has the same polarization but 180 degrees phase difference from that of state B. Another state is state A which has horizontal polarization with a zero degree phase shift, and state A' has horizontal polarization but with 180 degrees phase shift in relation to state A. Thus, by having four states available, the two transistors 12 and 14, in the close geometry shown in FIG. 1, are possible. These four states could be considered light with two attributes, wherein the light with each attribute is in two phases that are substantially 180 degrees out of phase with each other. In this polarization example, the two attributes are the two polarization orientations.

In this example, diagonal lines are drawn from the intersection of line 18 and lines 16 and 20 to form regions 32, 34, 36 and 38 with regard to transistor 12. With regard to transistor 14, diagonal lines are drawn at the intersection of line 24 and lines 22 and 26 to form regions 40, 42, 44 and 46. Region 32 adjoins line 16. Region 32 adjoins line 18. Region 36 adjoins line 18. Line 38 adjoins region 36 and line 20. Similarly, region 40 adjoins line 22, region 42 adjoins region 40 and line 24, region 44 adjoins line 24 and region 46 adjoins region 44 and line 26. Region 32 receives light in state B' that is of the same polarization but different phase than that of state B, which is present in region 30. The result is the cancellation of light at line 16 and thus the photoresist for line 16 is not exposed which is the desired result. Line 18 is formed by regions 34 and 36 receiving light in states A and A' respectively. State A is of the same polarization as state A'. State A and A', however, are 180 degrees out of phase with respect to each other. Thus, there is cancellation of light at line 18, which is the desired result. Line 20 is formed by light received by regions 38 and 30 having the states of B' and B, respectively. Thus, with states B and B' having the same polarization but a 180 degree phase difference with respect to each other, cancellation occurs at line 20. At the boundary of regions 32 and 34, however, states of light B' and A exist and are also 180 degrees different in phase but do not cancel. Because they are of different polarization, they do not destructively interfere, which is the desired result because that avoids forming an unwanted line.

Shown in FIG. 3 is a diagram which is similar to a logic diagram which shows the effect of the different states at boundaries of those states. For example, at the boundary between state A and A' is a 1 which indicates cancellation. At the boundary between A and B there is a zero that indicates there is not cancellation and photoresist will be exposed. Similarly, a boundary of state A and B' shows a zero that indicates light is not cancelled and photoresist is exposed. The effect of a boundary of states that show a 1 is that photoresist will not be exposed at that boundary and ultimately a line will be drawn. This may a polysilicon line, especially for minimum dimensions, but this is not limited to polysilicon and could be any type of drawn line.

Thus, now referring back to FIG. 1, line 22 shows a boundary of B and B' that indicates cancellation and the formation of line 22. Line 24 shows a boundary of states A and A' and thus cancellation of light and the formation of line 24. Line 26 has states B and B' at its boundary and thus the cancellation of light and formation of line 26. In this example, with only one type of light being available for region 30 due to the small dimension of region 30, it is necessary to have all four states. An attempt to place different states in region 30 particularly at the intersection of line 24, lines 22 and 26 would result in a design rule violation with the attendant reliability risks.

Figure 4:
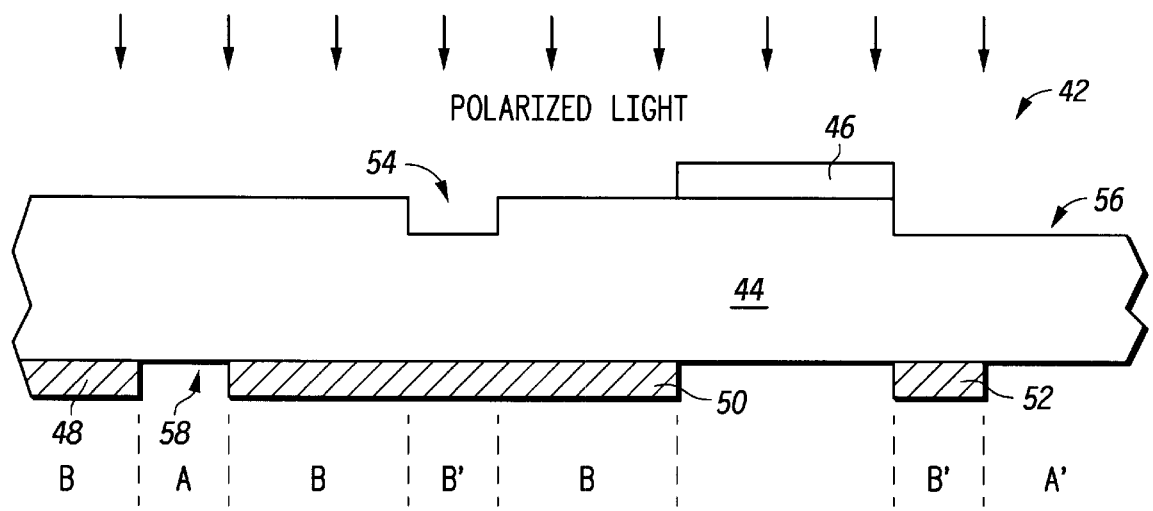
FIG. 4 is a cross section of a mask according to an embodiment of the invention.

Shown in FIG. 4 is a mask 42 that provides states A, A', B, and B' in response to receiving polarized light. Mask 32 comprises a substrate 44, an opaque region 46 on a top surface of substrate 44, a birefringent region 48 on a bottom surface of substrate 44, a birefringent region 50 on the bottom surface of substrate 44, a birefringent region 52 on the bottom surface of substrate 44, a phase shifting region 54 in the top surface of substrate 44, and phase shifting region 56. Phase shifting regions 54 and 56 are etched portions of substrate 44 that are etched to a depth that results in a 180 degree phase shift with respect to light passing through substrate 44 at its full thickness. The 180 degree phase differential is thus achieved by having a different thickness in mask 42 for the regions that are to be 180 degrees apart. Birefringent regions 48–52 contain a material, which is known as a birefringent material, that causes a 90 degree polarization rotation with respect to the received polarized light. State A is achieved by the polarized light passing through substrate 44 through its full thickness and not any birefringent material. State A' is achieved by the polarized light passing through the substrate via a phase shifting region such as regions 56 but not through any birefringent material. State B is achieved by the polarized light passing through substrate 44 through its full thickness and through birefringent material. State B' is achieved by the polarized light passing through the substrate via a phase shifting region such as regions 54 and 56 and through birefringent material. Light is blocked by opaque region 46, which may be chrome.

Thus, for example, polarized light passing through substrate 44 and birefringent region 48 results in light in state B passing on to the integrated circuit that is being exposed. Similarly, polarized light passing through substrate 44 via a region 58 between birefringent layers 48 and 50 is in state A. Following from left to right then, state B is between region 58 and region 54, state B' is under region 54, state B is between region 54 and region 46, substantially no light is under region 46, state B' is under region 52, and state A' is adjacent to region 52 under region 56. With opaque region 46 blocking the polarized light, there is not exposure to photoresist under opaque region 46 and the edges of opaque region 46 as passed on to the photoresist are sharp because the edges are exposed with the same polarization but different phases. The result is then a line in the integrated circuit caused by the pattern of opaque region 46.

There will also be other lines caused by mask 42. Both boundaries of region 54 will result in non exposure due to the cancellation of states B and B'. Thus, in the case of this mask 42, there will be two lines formed that are two areas of an interface between states B and B'. Mask 42 demonstrates how the four states, A, A', B, and B' may be formed into any pattern. With states A, A', B, and B' available, any pattern is available to be made in the integrated circuit.

Figure 5:
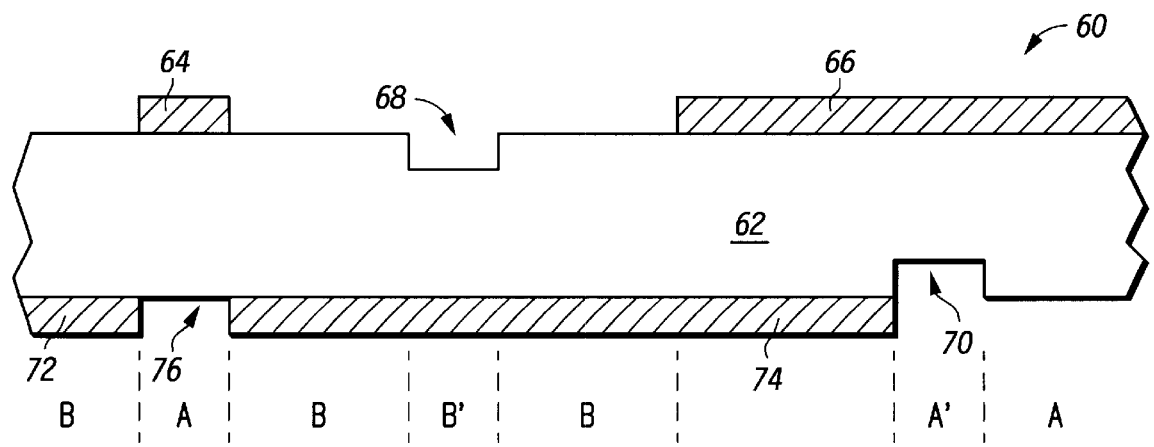
FIG. 5 is a cross section of a mask according to another embodiment of the invention.

Shown in FIG. 5 is a mask 60 that has the same pattern of the four states as that of mask 42 of FIG. 4. Mask 60 receives unpolarized light and converts it to two orthogonal directions of polarization. Mask 60 comprises a substrate 62, a polarizing region 64 on a top surface of substrate 62, a polarizing region 66 on the top surface of substrate 66, a phase shifting region 68 in the top surface of substrate 62, a phase shifting region 70 in bottom surface of substrate 62, a polarizing region 72 on the bottom surface of substrate 62, and a polarizing region 74 on the bottom surface of substrate 62. Polarizing regions 64, 66, 72, and 74 contain polarizing material that passes light that is polarized in a single direction. Polarizing regions 64 and 66 are oriented in a direction that is approximately 90 degrees different from that of regions 72 and 74. The result is that light passing through polarizing regions 64 and 66 but not through polarizing regions 72 and 74 will be polarized. Similarly, light passing through regions 72 and 74 but not through regions 64 and 66 will also be polarized. Light passing through region 66 in that portion of region 66 that overlaps region 74 will be blocked. The overlap of the two polarizing regions of perpendicular orientation effectively forms an opaque region.

Thus, for example, the overlap of regions 66 and 74 achieves the same result as opaque region 46 in FIG. 4. As a further example, the light passing through substrate 62 and region 72 results in state B and the light passing through substrate 62, polarizing region 64, and a region 76 between polarizing regions 72 and 74 results in light in state A. Light in state B is between phase shifting region 68 and polarizing region 64. Light in state B' is under phase shifting region 68. Light in state B is between phase shifting region 68 and polarizing region 66. Light in state A' is under phase shifting region A'. Light in state A is adjacent to phase shifting region 70 and under polarizing region 66. Thus, any pattern of the four states A, A', B', and B' may be achieved.

Thus, masks 42 and 46 show two different ways of achieving four states in which there are two combinations in which, when forming a boundary, light is cancelled along the boundary and in which all of the other combinations are not destructive at their boundaries. These two examples of masks, masks 42 and 60, each use polarized light to avoid destructive interference at phase boundaries that are not intended to have destructive interference while still achieving destructive interference at those boundaries where destructive interference is desired. There may be other ways to achieve this result. For example, two different colors (frequencies) of light may be used instead of different polarizations. This may be achieved by placing light filters on the mask. In such case, differing adjacent colors, with their differing frequencies, would not result in cancellation. Another alternative is to do exposures at different times. At a boundary where a line is not to be drawn, one side of boundary is exposed at one time and the other side at a subsequent time. Thus, even if the light on opposite sides of the boundary was of the same frequency and 180 degrees out of phase, there would not be destructive interference because these two states of the light would arrive at the photoresist at different times. Thus the first exposure would be to draw some precise lines and expose one side of the boundary of others where destructive interference is to be avoided. The second exposure would be to draw other precise lines and provide the complementary exposure to the boundaries that were half exposed during the first exposure. Thus, the equivalent of states A and A' would be provided during the first exposure and states B and B' would be provided during the second exposure.

With regard to the different time approach, there is the disadvantage of aligning consecutive masks, typically using a stepper. There is, however, also the advantage of being able to actually achieve some of the structures that are essentially impossible with the current approach of using the first mask step for all of the lines requiring phase shifting and a second mask for both removing the unwanted lines that are artifacts from the phase shifting done during the first exposure and patterning the routing polysilicon. That approach, for example, has not been demonstrated to be able to make T-gate transistors. Typical use of phase shifting masks is that polysilicon level where the gates are formed, but there is nothing in the embodiments described herein that restrict the use to polysilicon or the gate level.

The alignment issue that arises from using two masks can be alleviated by actually making two masks on the same reticle. The technique involves using one mask pattern for the first exposure and a second mask pattern for the second exposure but with no unloading and loading between the two mask exposures because both patterns are on the reticle that is loaded on the stepper. This is possible because it is the same photoresist layer that is being exposed by both exposures. Thus, many of the alignment issues that typically occur between mask steps are not present if the reticle contains both mask patterns. For example, the realignment of the reticle to the stepper is not required that is a major cause of alignment problems. Also the reloading process includes unloading and reloading the wafer. Thus the wafer has to be realigned, which is another major source of exposure to exposure alignment problems. These two major problems are thus avoided by putting both patterns, which are consecutively exposed, on the same reticle, The desired result is achieved by exposing the integrated circuit to one of the two patterns, moving the integrated circuit under the second of the two patterns, and then performing the subsequent exposure.

These three different approaches, polarizing, different colors, and different time, can also be implemented with reflective masks. For example, the incident light may be polarized and the surface could have a transparent polarizing material that is appropriately patterned. Similarly, the surface can be patterned to reflect different colors. Also in this reflecting case, the method of using different points in time for the exposures can be employed.

In the foregoing specification, the invention has been described with reference to specific embodiments. However, one of ordinary skill in the art appreciates that various modifications and changes can be made without departing from the scope of the present invention as set forth in the claims below. For example, the embodiments describe the utility of the invention in the context of forming gates, but the invention could be used for forming any feature such as, but not limited to, metal interconnect. Accordingly, the specification and figures are to be regarded in an illustrative rather than a restrictive sense, and all such modifications are intended to be included within the scope of present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A lithographic mask for making an integrated circuit, the mask comprising:
   a first region which passes light with a first phase and a first attribute of light;
   a second region which passes light with a second phase and a second attribute of light;
   a third region adjacent to the first and second region which passes light with the second phase and the first attribute of light;

a fourth region adjacent to the second region which passes light with first phase and the second attribute of light; and a fifth region adjacent to the first region and the fourth region having the second phase and the second attribute of light.

2. The lithographic mask of claim 1, wherein:

the first phase is about one hundred eighty degrees out of phase with the third phase; and the second phase is about one hundred eighty degrees out of phase with the fourth phase.

3. The lithographic mask of claim 2, wherein the first region has a first thickness and the third region has a second thickness different from the first thickness.

4. The lithographic mask of claim 2, further comprising:

a phase-shifting material applied to the third region and the fourth region.

5. The lithographic mask of claim 1, further comprising a fifth region which blocks light from the integrated circuit.

6. The lithographic mask of claim 5, further comprising:

a material opaque to an incident light applied to the mask wherein the material is attached to the fifth region.

7. The lithographic mask of claim 1, further comprising:

a birefringent material attached to at least the second region and the fourth region.

8. The method of claim 1, wherein:

the first attribute of light is a first polarization and the second attribute of light is a second polarization, wherein:
the first polarization is substantially orthogonal to the second polarization.

9. The lithographic mask of claim 8, further comprising:

a first polarizing film attached to at least the first region and the third region, the first polarizing film implementing the first polarization by receiving light from a non-polarized light source; and a second polarizing film attached to at least the second region and the fourth region, the second polarizing film implementing the second polarization by receiving light from the non-polarized light source.

10. The lithographic mask of claim 9, further comprising:

a portion of the first polarizing film and a portion of the second polarizing film attached to a fifth region, wherein the portion of the first polarizing film and the portion of the second polarizing film overlap each other and block light from the integrated circuit.

11. The method of claim 1, wherein:

the first attribute of light is a first frequency and the second attribute of light is a second frequency, wherein:
the first frequency is substantially different to the second frequency.

12. The method of claim 1, wherein:

the first attribute of light is a first exposure ending time and the second attribute of light is a second exposure starting time, wherein:
the second exposure starting time is approximately after the first exposure ending time.

13. A method for forming a pattern on an integrated circuit, the method comprising:

applying a first light to a first portion of the integrated circuit, wherein the first light has a first phase and a first attribute of light;

applying a second light to a second portion of the integrated circuit, wherein the second light has a second phase and a second attribute of light;

applying a third light to a third portion of the integrated circuit adjacent to the first and second portions, wherein the third light has the second phase and the first attribute of light;

applying a fourth light to a fourth portion of the integrated circuit adjacent to the second portion, wherein the fourth light has the first phase and the second attribute of light; and applying a fifth light to a fifth portion of the integrated circuit adjacent to the fourth portion and the first portion, wherein the fourth light has the second phase and the second attribute of light.

14. The method of claim 13, wherein:

a difference between the first attribute and the second attribute substantially prevents undesired interference when one of the first light or third light and one of the second light or fourth light are applied to regions of the integrated circuit which are adjacent each other.

15. The method of claim 14, wherein the undesired interference is destructive interference.

16. The method of claim 13, wherein the first light and the third light interfere to form an unexposed region.

17. The method of claim 16, wherein the unexposed region is useful in forming at least part of a gate.

18. The method of claim 13, wherein:

applying the first light and applying the third light are simultaneous.

19. The method of claim 14, wherein:

applying the second light and applying the fourth light are simultaneous.

20. The method of claim 13, wherein:

the first attribute of light is a first polarization and the second attribute of light is a second polarization, wherein:
the first polarization is substantially orthogonal to the second polarization.

21. The method of claim 13, wherein:

the first attribute of light is a first frequency and the second attribute of light is a second frequency, wherein:
the first frequency is substantially different to the second frequency.

22. The method of claim 13, wherein:

the first attribute of light is a first exposure ending time and the second attribute of light is a second exposure starting time, wherein:
the second exposure starting time is approximately after the first exposure ending time.

23. The method of claim 13, wherein:

the first phase is about one hundred eighty degrees out of phase with the third phase; and the second phase is about one hundred eighty degrees out of phase with the fourth phase.

24. A method for making a pattern on an integrated circuit, the method comprising:

applying a first light having an attribute and a phase to the integrated circuit through a first region;

applying a second light having an attribute and a phase to the integrated circuit through a second region to form an unexposed region at a first boundary, wherein:
the phase of the second light is approximately one hundred and eighty degrees out of phase with the of the first light;
the attribute of the second light is the same as the attribute of the first light; and
the first region and the second region are on opposing sides of the first boundary;

applying a third light having an attribute and a phase to the integrated circuit through a third region to form an exposed region at a second boundary, wherein:
- the second boundary is an interface between the second region and third region; and
- the attribute of the third light is different from the attribute of the second light;

applying a fourth light to the integrated circuit through a fourth region to form an unexposed region at a third boundary, wherein:
- the attribute of the fourth light is the same as the attribute of the third light;
- the phase of the fourth light is approximately one hundred and eighty degrees out of phase with the phase of the third light;
- the fourth region and the third region are on opposing sides of the third boundary; and applying a fifth light to the integrated circuit through a fifth region to form an unexposed region at a fourth boundary and an exposed portion at a fifth boundary: wherein:
- the attribute of the fifth light is the same as the attribute of the fourth light;
- the phase of the fourth light is approximately one hundred and eighty degrees out of phase with the phase of the fourth light;
- the fifth and fourth regions are on opposing sides of the fourth boundary; and
- the fifth and first regions are on opposing sides of the fifth boundary.

* * * * *

UNITED STATES PATENT AND TRADEMARK OFFICE
CERTIFICATE OF CORRECTION

PATENT NO. : 6,605,395 B2
DATED : August 12, 2003
INVENTOR(S) : Grobman et al.

It is certified that error appears in the above-identified patent and that said Letters Patent is hereby corrected as shown below:

Column 8,
Line 63, change "with the of the first light" to -- with the first light --

Signed and Sealed this

Sixteenth Day of December, 2003

JAMES E. ROGAN
*Director of the United States Patent and Trademark Office*